United States Patent [19]

Holleran et al.

[11] Patent Number: 4,775,596
[45] Date of Patent: Oct. 4, 1988

[54] COMPOSITE SUBSTRATE FOR INTEGRATED CIRCUITS

[75] Inventors: Louis M. Holleran, Big Flats; Gregory A. Merkel, Painted Post; Robert J. Paisley; Kathleen A. Wexell, both of Corning, all of N.Y.

[73] Assignee: Corning Glass Works, Corning, N.Y.

[21] Appl. No.: 15,992

[22] Filed: Feb. 18, 1987

[51] Int. Cl.$^4$ .................... B32B 15/00; C03C 10/12; C03C 3/23

[52] U.S. Cl. .................................. 428/432; 428/209; 428/210; 428/428; 428/901; 501/7; 501/43

[58] Field of Search ............... 501/7, 43; 428/209, 428/210, 428, 432, 901

[56] References Cited

U.S. PATENT DOCUMENTS 3,978,316  8/1976  Ross et al. ......................... 427/125
4,323,652  4/1982  Baudry et al. ........................ 501/73
4,490,429  12/1984  Tosaki et al. ........................ 428/195

Primary Examiner—John E. Kittle
Assistant Examiner—P. J. Ryan
Attorney, Agent, or Firm—C. S. Janes, Jr.

[57] ABSTRACT

This invention is particularly directed to the preparation of inorganic ceramic laminated structures for use as substrates in integrated circuit packages. One lamina is composed of a high thermal conductivity material, the second lamina is composed of a low thermal conductivity material having a dielectric constant below 10, a sintering temperature below 1050° C., and a linear coefficient of thermal expansion compatible with that of the other lamina, and a bonding medium sealing the two laminae together exhibiting flow at a temperature below the sintering temperature of the second lamina and a linear coefficient of thermal expansion compatible with those of the two laminae.

5 Claims, No Drawings

COMPOSITE SUBSTRATE FOR INTEGRATED CIRCUITS

BACKGROUND OF THE INVENTION

The need for new concepts in the construction of, and new materials for use in, the packaging of integrated circuits for high performance applications has been continuously driven by the ever-increasing demand for faster speed of operation and higher circuit density. For example, technology has been developed to pack ever greater numbers of transistors, the basic active electronic unit, onto a single silicon or gallium arsenide wafer or chip. Performance of the resulting devices (integrated circuits) requires them to be electrically connected to other devices and eventually to an operating medium. Integrated circuits must be protected from overheating, from physical abuse, and from the environment. The necessary connections and protections are supplied by encasing the unit in a package.

One component of such a package is a substrate or "chip carrier" which consists of a thin plate or wafer of an electrical insulator upon which one or more chips are mounted, and which serves as a base for metallized transmission lines which electrically interconnect the chips to one another and to the other components of the electronic device.

The largest volumes of integrated circuits produced today utilize packages prepared from organic plastics. Nevertheless, for long life, high reliability applications, hermetically sealed packages fashioned from inorganic ceramic materials have been employed. Such packages most frequently have been produced from alumina ($Al_2O_3$).

The speed at which the electronic device operates is in large part limited by the speed at which a signal can be propagated along those interconnects and the distance the signal must travel. Two means by which the signal speed can be increased comprise: (1) decreasing the electrical resistivity of the interconnect; and (2) utilizing a substrate material with a very low dielectric constant, inasmuch as the rate at which a signal propagates through the interconnect is inversely proportional to the square root of the dielectric constant of the surrounding medium.

Circuit density can be increased through the following three means: (1) employing a greater number of circuit components per unit area of chip; (2) enlarging the dimensions of the chip to thereby increase the number of chip components; and (3) utilizing a greater number of chips per substrate, which action also serves to accelerate signal speed since the chips are thereby placed in closer proximity to one another than where they are mounted on separate chip carriers. Increasing the circuit density, however, places two additional heavy demands on the package.

First, higher circuit density requires a greater number of interconnects, and avoiding crossover of the interconnects (with consequent short circuiting) often necessitates the use of a multilayer substrate. Such a laminated substrate construction involves metallized pathways passing over one another along different planes within the interior of the substrate. This construction requires co-firing of the metallized interconnects with the substrate material. That requirement limits the selection of metals suitable for interconnects to those having melting points higher than the temperature at which the substrate is sintered. At the present time the only ceramic material utilized in multilayer substrates for high performance applications is $Al_2O_3$. Because $Al_2O_3$ requires a sintering temperature of 1600° C. or higher, materials suitable for interconnects are limited to refractory metals such as tungsten and molybdenum. Those metals exhibit higher electrical resistivities than do copper, silver, or gold. Accordingly, signal speeds are not as fast as could be achieved if those latter, less refractory metals could be used.

Second, increased circuit density requires more effective heat removal from the package. Hence, higher switching speeds on the chip, coupled with a larger number of components and chips, result in greater heat generation. Excessive heat buildup can lead to chip failure or fracture of the solder bond between the chip and the substrate due to differences in thermal expansion. Consequently, heat dissipation is a major concern in numerous high performance applications and, quite apparently, could be improved by preparing the substrate from a material exhibiting a substantially higher thermal conductivity than that of $Al_2O_3$.

From the above discussion it is believed evident that significant advances in integrated circuit packaging could be achieved by fabricating substrates from materials which, when compared to $Al_2O_3$, demonstrate the following characteristics:

(1) a lower sintering temperature, specifically below 1050° C., so as to permit the use of metals of lower electrical resistivity for interconnects;

(2) a lower dielectric constant, preferably below 6; and (3) a substantially higher thermal conductivity.

The currently-available materials exhibiting low dielectric constants and low firing temperatures are principally found among glasses and glass-ceramics having compositions predominantly, but not exclusively, in the silicate system. Unfortunately, however, those materials inherently demonstrate very low thermal conductivities, i.e., at least one order of magnitude less than that of $Al_2O_3$. Consequently, the use of those materials is restricted to applications where the speed at which the electronic device operates is important, but effective heat dissipation is either not a critical factor or can be achieved by the incorporation of heat sinks and external cooling mechanisms. Whereas these devices may provide effective heat removal, they are expensive and cannot be used in many applications.

Conversely, materials exhibiting high thermal conductivities are available in the form of metals and also in certain ceramics which are characterized by covalent bonding, simple stoichiometries, and low average atomic mass. The metals, however, are electrically conductive and, hence, are not suitable as package substrates. Furthermore, although most of the ceramics demonstrating high thermal conductivity are electrically insulating, few have a dielectric constant which is significantly lower than that of $Al_2O_3$, and all demand sintering temperatures well in excess of 1050° C. This latter characteristic necessitates the use of more refractory and, concomitantly, more electrically resistive metals as interconnects in co-fired substrates. This situation results in highly conductive ceramic packages being restricted to applications where heat removal is more vital than enhanced operating speed of the electronic device.

SUMMARY OF THE INVENTION

The present invention is directed to the fabrication of a composite substrate for integrated circuit packaging which, in a relatively simple configuration, provides for high electrical conductivity interconnects in a matrix exhibiting a low dielectric constant to thereby promote faster signal speeds, and also provides a high thermal conductivity pathway for improved heat dissipation. Thus, the inventive product comprises a laminate consisting of at least two laminae which are bonded together wherein the material of one lamina demonstrates a thermal conductivity (k) below 25 W/m.K and the material of another layer maifests a thermal conductivity in excess of 50 W/m.K. The invention also comprehends a method for bonding the two layers to one another.

The lamina of low thermal conductivity functions as the base for most, if not all, of the metallized interconnects and, most desirably, is prepared from a material possessing a lower dielectric constant than the material comprising the layer of higher thermal conductivity, thereby minimizing the impedance of the signal through the interconnects. The lamina of low thermal conductivity may be metallized on the surface only, or it may comprise a multilayer body containing internal metallization. Further improvement in operating speed of the electronic device is gained when the metallization of the body of low thermal conductivity consists of a material exhibiting very high electrical conductivity such as metals containing copper, gold, palladium, or silver. With such metals, however, the body of low thermal conductivity must be prepared from a material capable of being sintered at temperatures below 1050° C. The layer of low thermal conductivity perferably consists of a glass, a glass-ceramic, or a glass-bonded ceramic since each of those possesses the advantages of demonstrating a low dielectric constant and a low sintering temperature. It is also quite desirable that the material comprising the lamina of low thermal conductivity has a linear coefficient of thermal expansion which is not far removed from that exhibited by the material constituting the layer of high thermal conductivity to which it is bonded, in order to minimize stresses resulting from thermal cycling of the composite body.

The material comprising the lamina demonstrating high thermal conductivity should have a linear coefficient of thermal expansion relatively close to that of the layer of low thermal conductivity and, preferably, close to that of the integrated circuit chip, e.g., silicon or gallium arsenide. This criterion is especially vital in package configurations where the chip is mounted directly to the layer of high thermal conductivity to promote effective uniform heat removal. Where the lamina of high thermal conductivity is composed of an electrically insulating material, then it may or may not contain or be in contact with metallized interconnects or input-/output (I/O) leads. On the other hand, where a metal or an electrically conductive cermet is employed as the layer of high thermal conductivity, care must be exercised in substrate design and fabrication to avoid bringing the layer into contact with the interconnects or I/O leads from the lamina of low thermal conductivity. Among metals deemed suitable for use as the layer of high thermal conductivity, tungsten has been selected as the most preferred, based upon its relatively low coefficient of thermal expansion ($\sim 46 \times 10^{-7}/°C.$) and high thermal conductivity (182 W/m.K). Among ceramic materials considered operable as the layer of high thermal conductivity, aluminum nitride (50-200 W/m.K) with a linear coefficient of thermal expansion of about $42-45 \times 10^{-7}/°C.$ and silicon carbide (50-270 W/m.K) with a linear coefficient of thermal expansion of about $36 \times 10^{-7}/°C.$, have been adjudged the most preferred because their linear coefficients of thermal expansion are close to those exhibited by silicon and gallium arsenide ($\sim 35 \times 10^{-7}/°C.$ and $\sim 60 \times 10^{-7}/°C.$), respectively. BeO might be considered but its extreme toxicity and higher coefficient of thermal expansion render it less attractive than either AlN or SiC.

Finally, the material employed for bonding the laminae together must satisfy the following five criteria:

(1) the material must provide a hermetic seal;

(2) the bond resulting must be strong;

(3) the sealing material must flow at a sufficiently low temperature such that none of the other components of the package deforms or is otherwise damaged from the heat;

(4) the material must be capable of forming the necessary seal in an atmosphere which is not reactive with any of the components of the package; and (5) the linear coefficient of thermal expansion of the sealing material must be compatible with the linear coefficients of thermal expansion of the laminae being bonded together.

Sealing materials fulfilling those requirements include glasses, devitrifying sealing glasses, metal solders, and metal-glass mixtures.

Our laboratory work has indicated the preferred components of the inventive composite substrates for integrated circuit packaging consist essentially of a lamina exhibiting high thermal conductivity prepared from a material selected from the group consisting of aluminum nitride, silicon carbide and tungsten, a lamina exhibiting low thermal conductivity consisting of an aluminosilicate glass-ceramic, and a bonding material consisting of a borosilicate glass. Because aluminosilicate glass-ceramic can be sintered at temperatures below 1000° C., and highly electrically conducting, but less refractory, metals containing copper, gold, palladium, and silver can be used for metallization. Such use greatly increases signal speed. Furthermore, because the dielectric constant of the glass-ceramic is less than 6 ($Al_2O_3 \sim 10$), signal lines in the package can be spaced more closely together. Furthermore, signal speeds along the metallized interconnects will be increased. Both of those factors result in faster device speeds. In addition, the high thermal conductivity of the AlN, SiC, and tungsten will reduce heat buildup and permit the actual device (chip or integrated circuit) to operate at greater power levels and/or with higher densities of active gates on the device itself.

DESCRIPTION OF THE PREFERRED EMBODIMENTS

As observed above, because they exhibit coefficients of thermal expansion compatible with silicon and gallium arsenide, the metal tungsten and the inorganic ceramics AlN and SiC constitute the preferred materials exhibiting high thermal conductivity, the latter two materials also possessing the advantage of being electrically insulating. AlN-based ceramics prepared in accordance with U.S. Application Ser. No. 937,209, filed Dec. 3, 1986 in the names of Pronob Bardhan and Gregory A. Merkel, now U.S. Pat. No. 4,719,187, are especially preferred because of their very high thermal conductivity, i.e., >70 W/m.K. Those bodies consist essentially of AlN containing, as analyzed by weight, about 0.02-25% of a metal selected from the group of Ba, Ca, Sr, Y, a lanthanide rare earth metal, and mixtures of those metals, and about 0.005-10% fluorine.

Again, because of their linear coefficients of thermal expansion and relatively low sintering temperatures, aluminosilicate glass-ceramics having compositions substantially free of $Li_2O$, $Na_2O$, and $K_2O$, and wherein the predominant crystal phase present consists essentially of cordierite ($2MgO.2Al_2O_3.5SiO_2$) and/or willemite ($2ZnO.SiO_2$), are particularly preferred because of their low electrical dissipation factors, their relatively low sintering temperatures, and the ease with which their linear coefficients of thermal expansion can be varied and controlled. It will be appreciated that, as employed here, the terms willemite and cordierite not only represent the above-quoted, classic, stoichiometric compositions, but also solid solutions thereof. Especially suitable glass-ceramics containing willemite as the predominant crystal phase are disclosed in U.S. Application Ser. No. 923,432, filed Oct. 27, 1986 in the names of Louis M. Holleran and Francis W. Martin, now U.S. Pat. No. 4,714,687. Those glass-ceramics consist essentially, in weight percent on the oxide basis, of about 15-45% ZnO, 10-30% $Al_2O_3$, and 30-55% $SiO_2$; up to 15% MgO may optionally be added. Such additions may lead to the development of cordierite as a second crystal phase.

Finally, and yet again because their linear coefficients of thermal expansion are compatible with silicon and gallium arsenide and because of their relatively low softening points, borosilicate glasses are particularly preferred as the bonding or sealing media. Hence, such glasses exhibit linear coefficients of thermal expansion (25°-300° C.) between about $25-45\times10^{-7}$/°C. and softening points between about 650°-900° C. Devitrifiable sealing glasses exhibiting proper linear coefficients of expansion as crystallized, e.g., compositions within the general lead titanium borosilicate system, are also operable.

In the following laboratory work, an AlN-based ceramic prepared in accordance with Ser. No. 937,209 above constituted the material exhibiting high thermal conductivity. A starting composition nominally consisting of 95% by weight AlN and 5% by weight $CaF_2$ (the AlN contained about 2-3% oxygen) was ballmilled using $Al_2O_3$ balls to yield powder having a mean diameter of less than 10 microns. A slurry of that powder was prepared by admixing the powder in an organic vehicle system to a solids:organic weight ratio of 3:2. The organic system consisted primarily of a binder (polyvinyl butyral), solvents (toluene and ethanol), and a surfactant (phosphate ester). The slip was ball-milled overnight and thereafter continuously applied at a thickness of about 0.005-0.02" onto a polyethylene carrier film or tape using a doctor blade. After allowing to dry in air at ambient temperature to evaporate the organic materials, the tape was cut into squares having dimensions of about 3"×3", 8 to 10 of those squares stacked up, and the stacks pressed at 2500 psi at a temperature of 75°-85° C.

The pressed stacks were heated in air at 50° C./hour to 500° C. and held at that temperature for five hours to burn out the organic components. The samples were then sintered to essentially full theoretical density at 1900° C. for four hours in a nitrogen atmosphere. After firing, the AlN typically contained <0.4% by weight oxygen, <0.02% by weight calcium, and <0.01% by weight fluorine.

Three different glass-ceramic compositions were employed as materials demonstrating low thermal conductivity and low dielectric constant. Their compositions are tabulated in Table I in terms of parts by weight on the oxide basis. Inasmuch as the sum of the recited components totals or very closely approaches 100, for all practical purposes the values reported for the individual ingredients can be deemed to reflect weight percent. Batches of the proper formulation were compounded, ballmilled together to aid in achieving a homogenous melt, and charged into platinum crucibles. The crucibles were introduced into a furnace operating at about 1650° C., maintained therewithin for about six hours, the melt then either poured into a steel mold to yield a glass slab, and that slab immediately transferred to an annealer operating at about 700°-800° C., or the melt poured as a rather thin stream into a bath of cold water (drigaged) to break up the stream into small glass particles.

The slab was crushed and ballmilled, using $Al_2O_3$ balls, and the drigaged particles further comminuted to a mean particle size of about 3.5 microns. The resulting particles were admixed with the same organic vehicle system and in the same proportions as described above with regard to the AlN material. Also in like manner, tape was prepared therefrom, cut into 3" squares, and stacks of the squares pressed. Thereafter, the pressed squares were heated in air at 50° C./hour to 500° C. and maintained at that temperature for five hours to burn out the organic constituents, after which the temperature was raised to about 925°-975° C. and held thereat for about 0.5-2 hours. Examples 1 and 2 were highly crystalline and contained cordierite as essentially the sole crystal phase. Example 3 was also highly crystalline and contained cordierite as the predominant crystal phase with a minor amount of zinc silicate.

TABLE I

|  | 1 | 2 | 3 |
|---|---|---|---|
| $SiO_2$ | 56.8 | 53.0 | 51.0 |
| $Al_2O_3$ | 24.1 | 22.0 | 24.8 |
| MgO | 19.1 | 25.0 | 13.1 |
| BaO | — | — | 3.1 |
| $B_2O_3$ | — | — | 1.4 |
| ZnO | — | — | 6.5 |

The sintered pieces of AlN and the three glass-ceramics were cut into 0.6" squares with the AlN square being additionally ground on both sides using SiC particles passing a No. 200 U.S. Standard Sieve (74 microns). The final thickness of the squares ranged about 0.04-0.05". A tungsten bar (99.9% pure) was cut into 0.5" squares having a thickness of 0.25". After cutting and grinding, the samples were cleaned ultrasonically in distilled water, rinsed in isopropanol, and dried.

Recorded below in Table II for each of the above materials, where determined, are the linear coefficient of thermal expansion (Coef. Exp.) over the temperature range of 25°-300° C. expressed in terms of $\times10^{-7}$/°C., the dielectric constant (Diel. Con.), and the thermal conductivity (Ther. Cond.) expressed in terms of W/m.K, utilizing conventional measuring techniques.

TABLE II

|  | AlN | Tungsten | 1 | 2 | 3 |
| --- | --- | --- | --- | --- | --- |
| Coef. Exp. | 45 | 46 | 40 | 40 | 28 |
| Diel. Con. | 8.5 | | 5.6 | 5.6 | 5.5 |
| Ther. Cond. | 110 | 180 | <2 | <2 | <2 |

Because of their ease of handling and ready availability, three borosilicate glasses were used as bonding media. The catalog of Corning Glass Works, Corning, N.Y. lists 32 borosilicate glasses of varying compositions demonstrating the chemical and physical criteria rendering them potential candidates as bonding media. The three chosen for the laboratory work being described where Corning Code 7574, Corning Code 7740, and Corning Code 7761. We also used one devitrifying glass frit of the type described in U.S. Pat. No. 3,488,216, the predominant crystal phase being generated therein consisting of lead titanate ($PbO \cdot TiO_2$). The compositions of the three borosilicate glasses and the devitrifying glass frit are reported in Table III along with the softening points (Soft. Pt.) and linear coefficients of thermal expansion (Coef. Exp.) of the borosilicate glasses over the temperature range of 25°-300° C. in terms of $\times 10^{-7}/°C$. Because the glass frit devitrifies so rapidly, the softening point and coefficient of thermal expansion are very difficult to measure. However, the frits disclosed in Pat. No. 3,488,216 are conventionally used to glaze borosilicate glass articles. Table III also lists the softening points (Soft. P.) of the glasses and the maturing temperature (Cryst.) of the devitrifying frit.

TABLE III

|  | 7574 | 7740 | 7761 | Devit. |
| --- | --- | --- | --- | --- |
| $SiO_2$ | 12.5 | 80.8 | 73.4 | 7.0 |
| $B_2O_3$ | 22.5 | 12.5 | 23.9 | 7.0 |
| $Al_2O_3$ | — | 2.3 | — | 1.0 |
| ZnO | 65 | — | — | 10.0 |
| $Na_2O$ | — | 4.0 | — | — |
| $K_2O$ | — | — | 2.7 | — |
| $TiO_2$ | — | — | — | 12.0 |
| PbO | — | — | — | 63.0 |
| Coef. Exp. | 42 | 33 | 28 | — |
| Soft. P. | 644° C. | 821° C. | 820° C. | — |
| Cryst. | — | — | — | 620° C. |

As can be observed, the above compositions exhibit coefficients of thermal expansion between the glass-ceramic material of low thermal conductivity and the AlN and tungsten, and a softening or crystallization temperature below 950° C. Furthermore, each composition demonstrates excellent resistance to weathering.

Frits of the three commercial glasses were prepared by merely crushing and ballmilling articles to an average particle size less than 5 microns. With respect to the devitrifying sealing glass, a batch of the proper composition was compounded, the components thoroughly mixed together, charged into a platinum crucible, and melted for about two hours at about 1200° C. The melt was run as a small stream into a bath of cold water (drigaged). The resultant glass particles were thereafter ballmilled to an average particle size less than 5 microns.

In the following examples slurries of each of the four frits were formed by dispersing them in isopropanol in a solids:isopropanol weight ratio of 2:1 and ballmilling for 30 minutes. Each AlN or tungsten/glass-ceramic composite was prepared by applying a thin layer of the frit slurry over the surface of the AlN or tungsten plate with an eye dropper and the glass-ceramic plate immediately placed upon the wet surface. After drying in air, the assembled unit was heated either in air (oxidizing atmosphere) or in 92% nitrogen, 8% hydrogen forming gas (reducing atmosphere) at a rate of about 200° C./hour to the maximum temperature specified, maintained at that temperature for one hour, cooled at about 100° C./hour to 500° C., held at that temperature for one hour, and then cooled to room temperature at about 150° C./hour. Forming gas was employed to simulate the low oxygen partial pressure conditions necessary for bonding a copper-metallized glass-ceramic to AlN or tungsten.

EXAMPLES I-III

Plates of AlN and glass-ceramic No. 3 with a slurry of borosilicate glass No. 7574 deposited therebetween were fired in air to maximum temperatures of 800° C. and 950° C. and in forming gas to 850° C. All of the samples demonstrated good bonding. The 7574 glass appeared translucent but was quite evidently well sintered and bonded to both the AlN and the glass-ceramic.

EXAMPLES IV-VII

Plates of AlN and glass-ceramic No. 3 with a slurry of borosilicate glass No. 7740 deposited therebetween were fired in air to maximum temperatures of 750° C., 800° C., 850° C., and 950° C. The assemblies fired at 800° C., 850° C., and 950° C. were easily broken apart, tending to fracture close to the surface of the AlN plate, with only thin patches of glass adhering to the AlN. The 7740 glass appeared opaque to slightly translucent and was well sintered with no porosity. In contrast, the assembly fired at 750° C. evidenced strong bonding. It is thought that, through optimization of particle size and frit loading, glass 7740 could perform very satisfactorily as a bonding medium.

EXAMPLES VIII-XI

Plates of AlN and glass-ceramic No. 3 with a slurry of borosilicate glass No. 7761 deposited therebetween were fired in air at 800° C., 850° C., and 950° C. and in forming gas at 850° C. All of the samples exhibited excellent bonding. The 7761 frit had softened and sintered to a fully dense, transparent glass which displayed optimum wetting and adherence to both the AlN and glass-ceramic No. 3.

EXAMPLE XII

A composite body comprising a plate of AlN and a plate of glass-ceramic No. 2 with a square of the devitrifying glass frit tape inserted therebetween was fired in air to a maximum temperature of 620° C. employing the following approximate time-temperature schedule: the temperature was raised at about 175° C./minute to 580° C.; that temperature was held for 5 minutes; the temperature was raised at about 10° C./minute to 620° C.; that temperature was held for 15 minutes; the temperature was lowered to ambient at about 100° C./minute. Whereas the assembly was adhered together, the seal between the parts was not hermetic. The type of devitrifying glass frit appeared to have shrunk during the firing.

EXAMPLE XIII

A composite body comprising a plate of AlN and a plate of glass-ceramic No. 2 with a square of devitrifying glass frit tape inserted therebetween was fired in a nitrogen atmosphere to a maximum temperature of 620° C. utilizing the following approximate time-temperature schedule: the temperature was raised at about 100° C./minute to 580° C.; that temperature was held for 10 minutes; the temperature was raised at about 10° C./minutes to 620° C.; that temperature was held for 30 minutes; the temperature ws lowered to ambient at about 50° C./minute. The fired assembly exhibited a seal similar to that demonstrated by Example XII.

EXAMPLES XIV-XV

A laminate consisting of a plate of tungsten and a plate of glass-ceramic No. 3 with a slurry of borosilicate glass No. 7574 deposited therebetween was fired at 850° C. in forming gas (to prevent oxidation of the tungsten), and a laminate consisting of a plate of tungsten and a plate of glass-ceramic No. 3 with a slurry of borosilicate glass No. 7721 deposited therebetween was likewise fired at 850° C. in forming gas. After firing, the outer surfaces of the tungsten indicated on oxidation. Both assemblies could be split apart manually with some difficulty. In each instance, however, the fracture propagated first along the tungsten/sealing glass interface and then diverted up through the glass-ceramic plate, leaving a portion of the glass-ceramic firmly bonded to the metal. Therefore, it is believed that with further understanding of the glass-to-metal bonding mechanism, proper surface preparation of the metal, and optimization of the sealing glass composition, it will be possible to fabricate a well-bonded tungsten/glass-ceramic composite substate.

EXAMPLE XVI

A slurry of borosilicate glass No. 7574 powder having a mean diameter of less than 5 microns was prepared by dispersing in an organic vehicle system in a solids:organic weight ratio of 3:2. The organic system consisted principally of a binder (polyvinyl butyral), solvents (toluene and ethanol), and a surfactant (phosphate ester). The resultant slip was ballmilled overnight and thereafter continuously applied at a thickness of about 0.005-0.02" onto a polyethylene carrier film or tape using a doctor blade. After allowing to dry in air at ambient temperature to evaporate the organic materials, the tape was cut into squares having dimensions of about 3"×3", 3 of these squares stacked up, and the stacks pressed at 2500 psi at a temperature of 75°-85° C. The pressed stacks were heated in air at 50° C./hour to 500° C. and held at that temperature for five hours to burn out the organic components.

A composite body consisting of a plate of AlN and a plate of glass-ceramic No. 2 with a square of the above 7574 tape inserted therebetween was fired in air to a maximum temperature of 750° C. utilizing the following approximate time-temperature schedule: the temperature was raised at about 150° C./minute to 720° C.; that temperature was held for 7 minutes; the temperature was raised at about 7° C./minute to 750° C.; that temperature was held for 20 minutes; the temperature was lowered to ambient at about 75° C./minute. The fired assembly displayed good adhesion, the sealant evidencing a yellowish foam appearance.

EXAMPLE XVII

A thick paste was prepared composed of borosilicate glass No. 7574 powder having a mean diameter less than 5 microns dispersed in amyl acetate as the vehicle. A thin layer of paste was applied to the surface of a plate of AlN and a plate of glass-ceramic No. 1 placed on top of the paste layer. The assembly was fired to a maximum temperature of 750° C. utilizing the time-temperature schedule employed above in Example XVI. The fired assembly exhibited excellent bonding, the sealant being free of any foam.

EXAMPLE XVIII

A thin layer of the paste described above in Example XVII was applied to the surface of a plate of AlN and a plate of glass-ceramic No. 3 placed atop the paste layer. The assembly was fired to a maximum temperature of 750° C. utilizing the time temperature schedule of Example XVI. The fired assembly manifested good adhesion initially, but broke apart during cooling to room temperature. This breakage is believed to have resulted from the wide mismatch in linear coefficients of AlN ($\sim 47 \times 10^{-7}$/°C.) and glass-ceramic No. 3 ($\sim 28 \times 10^{-7}$/°C.).

Whereas the above Examples described the formation of a two-component laminate, i.e., one lamina of a high thermal conductivity material and a lamina of a low thermal conductivity material, it will be appreciated that structures comprising multiple two-component laminates can be fabricated in accordance with the inventive method. Also, an assembly consisting of a lamina of a high thermal conductivity materail can be "sandwiched" between two laminae of a low thermal conductivity material.

We claim:

1. A laminated structure consisting of at least two inorganic laminae bonded together with an inorganic ceramic bonding medium wherein the material of the first lamina exhibits a thermal conductivity in excess of 50 W/m·K selected from the group consisting of tungsten, AlN, and SiC, the material of the second lamina exhibits a thermal conductivity below 25 W/m·K, a dielectric constant below 10, a sintering temperature below 1050° C., and a linear coefficient of thermal expansion compatible with that of the first lamina selected from the group consisting of glass, glass-ceramic, and glass-bonded ceramic, and the material of the bonding medium exhibiting flow at a temperature below the sintering temperature of the second lamina and a linear coefficient of thermal expansion compatible with those of the first and second laminae selected from the group consisting of borosilicate glasses and devitrifiable sealing glasses having a composition within the lead titanium borosilicate system.

2. A laminated structure according to claim 1 wherein the material of said first lamina is electrically insulating.

3. A laminated structure according to claim 1 wherein said glass-ceramic is essentially free of $Li_2O$, $Na_2O$, and $K_2O$ and wherein the predominant crystal phase is selected from the group consisting of cordierite, willemite, and mixtures of those phases.

4. A laminated structure according to claim 3 wherein said willemite-containing glass-ceramic consists essentially, expressed in terms of weight percent on the oxide basis, of about 15-45% ZnO, 10-30% $Al_2O_3$, and 30-55% $SiO_2$.

5. A laminated structure consisting of a first inorganic ceramic lamina, wherein the material of said first lamina exhibits a thermal conductivity in excess of 50 W/m·K selected from the group consisting of tungsten, AlN, and SiC, sandwiched between two inorganic ceramic laminae exhibiting a thermal conductivity below 25

W/m·K, a dielectric constant below 10, a sintering temperature below 1050° C., and a linear coefficient of thermal expansion compatible with that of said first lamina selected from the group consisting of glass, glass-ceramic, and glass-bonded ceramic, said first lamina being bonded between said two laminae through a inorganic ceramic bonding medium selected from the group consisting of borosilicate glasses and devitrifiable sealing glasses having a composition within the lead titanium borosilicate system.

* * * * *